US011899053B2

(12) United States Patent
Najafi

(10) Patent No.: US 11,899,053 B2
(45) Date of Patent: Feb. 13, 2024

(54) ACOUSTIC CONDITION MONITORING METHOD AND SYSTEM FOR ELECTRICAL POWER COMPONENTS, IN PARTICULAR TRANSFORMERS

(71) Applicant: Siemens Gamesa Renewable Energy Service GmbH, Hamburg (DE)

(72) Inventor: Seyed Amir Mahmood Najafi, Kirchheim unter Teck (DE)

(73) Assignee: Siemens Gamesa Renewable Energy Service GmbH, Hamburg (DE)

( * ) Notice: Subject to any disclaimer, the term of this patent is extended or adjusted under 35 U.S.C. 154(b) by 569 days.

(21) Appl. No.: 17/053,294

(22) PCT Filed: May 7, 2019

(86) PCT No.: PCT/EP2019/061695
§ 371 (c)(1),
(2) Date: Nov. 5, 2020

(87) PCT Pub. No.: WO2019/215162
PCT Pub. Date: Nov. 14, 2019

(65) Prior Publication Data
US 2021/0190849 A1    Jun. 24, 2021

(30) Foreign Application Priority Data

May 7, 2018   (DE) .................... 102018003744.5

(51) Int. Cl.
*G01R 31/12*    (2020.01)
*F03D 17/00*    (2016.01)
(Continued)

(52) U.S. Cl.
CPC ......... *G01R 31/1209* (2013.01); *F03D 17/00* (2016.05); *F03D 80/50* (2016.05); *G01R 31/1272* (2013.01); *G01R 31/62* (2020.01); *G08B 21/182* (2013.01); *F05B 2260/80* (2013.01)

(58) Field of Classification Search
CPC ............ G01R 31/1209; G01R 31/1218; G01R 31/1227; G01R 31/1272; G01R 31/1245;
(Continued)

(56) References Cited

U.S. PATENT DOCUMENTS 4,095,173 A  *  6/1978  Darrel ................ G01R 31/1209
324/535
2004/0204873 A1    10/2004  Freisleben et al.
(Continued)

FOREIGN PATENT DOCUMENTS

DE        60025927 T2     9/2006
DE     102010061606 A1    6/2012
(Continued)

OTHER PUBLICATIONS

International Search Report and Written Opinion dated Aug. 8, 2019, directed to International Application No. PCT/EP2019/061695; 18 pages.

*Primary Examiner* — Thang X Le
(74) *Attorney, Agent, or Firm* — Morrison & Foerster LLP

(57) ABSTRACT

A condition monitoring system and method for electrical power components, in particular a transformer. A partial discharge detector unit captures acoustic signals of the partial discharge by means of an A-sensor. A processing unit captures a frequency of the partial discharges detected by the A-type sensor and a histogram module determines a temporal profile of the frequency from the frequency signal and a time signal. An analysis unit monitors the temporal profile for a fall and/or rise, preferably by means of pattern recognition. A warning signal is triggered if an adjustable threshold is exceeded. An imminent failure of an electrical power (Continued)

component can therefore be detected in good time and warned of; the component can be automatically disconnected if appropriate.

21 Claims, 2 Drawing Sheets

(51) Int. Cl.
*F03D 80/50* (2016.01)
*G01R 31/62* (2020.01)
*G08B 21/18* (2006.01)

(58) Field of Classification Search
CPC ............ G01R 31/1254; G01R 31/1263; G01R 31/081; G01R 31/083; G01R 31/52; G01R 31/58; G01R 31/62
See application file for complete search history.

(56) References Cited

U.S. PATENT DOCUMENTS

| | | | | |
|---|---|---|---|---|
| 2007/0252603 | A1* | 11/2007 | Restrepo | H02H 1/0015 |
| | | | | 324/536 |
| 2011/0030479 | A1* | 2/2011 | Murai | G01N 29/223 |
| | | | | 73/632 |
| 2014/0233686 | A1* | 8/2014 | Choi | G01N 29/4463 |
| | | | | 375/349 |
| 2017/0363675 | A1* | 12/2017 | Umemoto | G01R 31/40 |
| 2020/0321767 | A1* | 10/2020 | Meyer | H02H 3/38 |
| 2020/0379028 | A1* | 12/2020 | Rosenzweig | G01R 31/1272 |

FOREIGN PATENT DOCUMENTS

| | | |
|---|---|---|
| EP | 1439396 A2 | 7/2004 |
| EP | 1222472 B1 | 2/2006 |

* cited by examiner a)

b)

c)

ACOUSTIC CONDITION MONITORING METHOD AND SYSTEM FOR ELECTRICAL POWER COMPONENTS, IN PARTICULAR TRANSFORMERS

CROSS-REFERENCE TO RELATED APPLICATIONS

This application is a U.S. national stage application under 35 USC 371 of International Patent Application No. PCT/EP2019/061695, filed May 7, 2019, which claims the priority of DE Application No. 102018003744.5, filed on May 7, 2018, the entire contents of each are incorporated herein by reference.

FIELD OF THE DISCLOSURE

The invention relates to a condition monitoring system and corresponding method for electrical power components, in particular a transformer, comprising a detector unit for detecting partial discharges, and comprising at least one sensor for detecting acoustic signals of a partial discharge.

BACKGROUND OF THE DISCLOSURE

Electrical power components such as, for example, transformers are often operated under rough use conditions. This is particularly the case with modern wind turbines, which are often erected and operated in inhospitable and remote locations. This applies particularly to wind turbines positioned at sea in so-called offshore wind farms. In the case of such turbines, access for maintenance and repair work is difficult. The wind turbines and their components, in particular their power-conducting components (power components), are therefore designed to have a long life. Nevertheless, it may arise, however, that power components fail prematurely. In particular in the case of transformers, there is the problem that although they generally have a long life, a certain proportion of the transformers do nevertheless fail prematurely. Since in the case of such a failure continued operation of the wind turbine is no longer possible, quick repair work is required. This may be complex, in particular in the case of remote wind turbines or those at sea.

A significant cause of premature failures of electrical power components, in particular transformers, are so-called partial discharges. Should in this case a sudden discharge occur in the insulator material, whether it be in the oil in the case of oil-insulated power components or in other, in particular solid, poorly conducting materials (insulator material, possibly also semiconductor), this is referred to as a partial discharge (PD). A partial discharge per se is generally not damaging, but any partial discharge can result in a certain degree of local damage. Depending on the extent and number of the partial discharges, over time they result in failure of the electrical power component. In principle, it can be said that any partial discharge forms an infinitesimal step on the path to destruction of the electrical power component, in particular a transformer. Partial discharges per se are only avoidable with a very high degree of complexity involved by means of a complex design. Since at least economic considerations stand in the way of this, oil transformers, for example, are designed in such a way that partial discharges of up to 100 pC can be considered to be undamaging. Attempts have been made to detect the occurrence of partial discharges and to make this the basis of monitoring for the power component. In principle, partial discharges can be identified from the electrical currents caused by the discharge and their electromagnetic fields. The partial discharges are also often accompanied by corresponding acoustic phenomena, such as cracking noises. These noises may be more or less loud depending on the size of the partial discharge. However, they are not always audible; there are also so-called silent partial discharges, i.e. ones which cannot be detected acoustically, which can then only be detected from their electrical and electromagnetic effects. These also include very quiet partial discharges.

On the basis thereof, attempts have been made to provide sensors for electrical fields in order thus to detect signals of partial discharges. Precisely in the case of electrical power components having high electromagnetic field strengths (in particular transformers), however, this has sometimes proven to be difficult. Severe changes in the electromagnetic fields can also simply be based on the operation of the component and may also occur without any partial discharges. Reliable identification of the comparatively weaker signals of the partial discharges could thus not be achieved.

Attempts have also been made at methods using electrical and acoustic sensors. For example, WO 01/18554 A1 has disclosed a monitoring system for monitoring partial discharges. An ultrasonic transducer for detecting acoustic signals is provided on the monitored power component, and in addition sensors for identifying electrical, in particular electromagnetic signals are provided. If partial discharges occur, the sensors identify corresponding radiofrequency electrical fields. In order to verify that the detected electrical fields are also those due to a partial discharge, evaluation of the signals of the acoustic sensor is additionally provided. Only when a corresponding acoustic signal follows within a short predetermined time span after the occurrence of an electromagnetic signal is the measured process evaluated as a partial discharge. In this way, the acoustics act as a filter for improving the signal quality. One problem with this concept consists in that there are certain partial discharges which do not have any or only a very quiet acoustic signature; these are then often not identified as partial discharge but are suppressed by the filtering. The desired improvement in acoustic and electromagnetic quality as a result of the use of both sensor data is thus at least partially nullified.

BRIEF SUMMARY OF THE DISCLOSURE

According to various embodiments, reliable monitoring using as simple means as possible is achieved via a method or condition monitoring system.

According to various embodiments, a condition monitoring system for electrical power components, in particular a transformer, comprises a partial discharge detector unit, which is designed to detect partial discharges, comprising at least one A-Sensor for detecting acoustic signals; and a processing unit for processing the signals detected by the A-Sensor, provision is made according to the invention for the processing unit to comprise an incidence rate determination device, which detects an incidence rate of the partial discharges detected by the A-Sensor and outputs an incidence rate signal, and a histogram module, which is designed to determine a time characteristic of the incidence rate from the incidence rate signal and a time signal, and for an analysis unit to be provided, which is designed to monitor the time characteristic for fall and/or rise and to trigger a warning signal when a settable threshold is exceeded.

In general, a usually creeping impairment of the condition of materials of the electrical power component arises in particular as a result of the thermal effects brought about by partial discharges. In the case of transformers, this is in particular insulator material. This includes liquid or solid substances, such as, for example, oil or insulating paper. This will be explained using the example of insulating paper: owing to the thermal effect, carbonizations in the insulating paper take place, as a result of which the electrical insulation capacity of said insulating paper is reduced. In principle it applies that the greater the partial discharge and therefore the greater the carbonization, the stronger the acoustic signature is as well.

The incidence rate is understood to be a general measure of how often an incident (such as the partial discharge) occurs. The occurrence of the incident ("incidence") per se is what the "incidence rate" refers to; this should be distinguished from a frequency of an acoustic signal ("pitch").

According to various aspects, the invention enables improved determination of the degree of damage on the basis of acoustic detection of the partial discharges. This is based on the knowledge that the detection of silent partial discharges which can only be realized with difficulty is not involved here at all because these are not relevant for damage and in particular carbonizations in the solid. Therefore, it is in principle sufficient when certain changes in the incidence rate are used as a basis in the evaluation of the acoustically detected partial discharges. Here, the invention makes use of the fact that, in particular, combinations of falls and rises enable good determination of damage as a result of partial discharges, to be precise independently of the total number of partial discharges. Specifically, the present invention makes use of the knowledge that the very first acoustic signal of the very first non-silent partial discharge (PD) in the solid generally has the highest acoustic amplitude. Thereafter, both the amplitudes of the acoustic signals and the incidence rate of the partial discharges decrease owing to the carbonization which has now begun and is progressing further. This can be detected. The invention has further identified that as soon as a marked increase in the incidence rate follows this fall in the incidence rate (after generally a relatively long period of time with a low incidence rate), this is a clear indication of severe imminent damage and threat of failure of the component. The invention makes use of this by virtue of monitoring the incidence rate for such a combination of fall and rise.

Thus, according to various aspects, the invention makes it possible to identify the probable failure of an electrical power component in good time and correspondingly to issue a warning and, if appropriate, also to shut down the component, whether it be automatically or after corresponding checking and approval. The fact that this occurs without taking into consideration the silent partial discharges which can only be detected with difficulty or not at all cannot be found as an example in the relevant prior art.

Expediently, the analysis unit has a pattern identification module, which comprises at least one reference pattern and is designed to assess whether the time characteristic corresponds to the reference pattern. In this way, heuristics can be achieved in order thus to improve the identification accuracy. It has proven particularly successful to input certain patterns for falls and rises as reference pattern. The pattern identification module checks whether the time characteristic of the incidence rate signals corresponds to the reference pattern. Advantageously here, the reference pattern is polyphasic. A division into start phase, main phase and end phase has proven successful. The start phase in this case often comprises the start-up and the subsequent "burn-in", i.e. a phase with a comparatively high incidence rate of partial discharges in the electrical power component, the main phase comprises the subsequent closed-loop control (during which partial discharges usually only occur with a low incidence rate), and the end phase is characterized by a marked rise in the incidence rate of the partial discharges. Reliable identification of the main phase in this case presupposes knowledge of the partial discharges in the start phase.

Particularly expedient is automatic parameterization of the reference pattern. This preferably comprises automatic amplification control. In this way, matching to the absolute level of the measured incidence rates can take place automatically. Thus, simple matching to different electrical power components can take place, to be precise depending on whether they have a generally higher level of partial discharges or a lower level. As a result of such automatic amplification control, optimum matching can be achieved. Erroneous parameterizations can therefore be prevented, with the result that the identification accuracy increases.

The signals recorded by acoustic sensors can be impaired by environmental noise. In order to reduce the influence of this environmental noise, an adaptation is advantageously provided. This is designed to perform a calibration of the analysis unit in respect of environmental noise. In this way, the influence of the environmental noise can be taken out. In the simplest way, this can be realized by a minimum detector, which detects the "noise floor" and correspondingly compensates for the processing of the measured signals.

It is expedient if the analysis unit is furthermore designed to calculate a rate of rise of the incidence rate and, depending thereon, to trigger the warning signal. It has been shown that precisely the rate of rise is a very suitable measure for identifying a marked impairment of the electrical component in good time. In principle, a static threshold value is sufficient as the threshold for the triggering of a warning signal. In addition or alternatively, however, provision may also be made for a dynamic threshold value to be included. This can be varied, for example, depending on coordinate factors, such as the level of the noise floor or the interference as a result of near and environmental noise, or else historic factors, such as, for example, how long a phase of the reference pattern is already lasting.

Advantageously, a switch-on lockout is provided, which interacts with the processing unit and/or the analysis unit in such a way that, after a shutdown, the monitoring of the partial discharges is blocked during subsequent restarting. For example, this can take place by monitoring the terminal voltage of the transformer. This avoids a situation whereby discharges or partial discharges which unavoidably occur during shutdown and in particular during subsequent restarting falsify the evaluation. Otherwise, there is the risk that an incorrect conclusion is drawn in respect of an imminent defect as a result of the increase in the incidence rate of the partial discharges effected during shutdown/restarting. This is effectively prevented by the switch-on lockout.

Preferably, the analysis unit furthermore has a burst detector for the detected partial discharges, which is designed to trigger the warning signal when a threshold value is exceeded. Thereby, it is possible to react in a targeted manner when a whole burst of partial discharges is suddenly acoustically detected. This may also be a significant sign of an imminent failure of the electrical power component. In this case, limits can be preset for the number of partial discharges and duration of the bursts.

In accordance with a particularly preferred configuration of the invention which may deserve independent protection, provision is additionally made for localization of the acoustic signals to take place during the processing. For this purpose, the processing unit can be provided with a locator unit. Said locator unit is designed to determine location information relating to the location of the partial discharge which has occurred from the signals of the acoustic sensor. Preferably, a plurality of acoustic sensors is provided spatially distributed on the power component for this purpose. During the evaluation, the signals of this plurality of acoustic sensors are then combined with one another, to be precise expediently in a phase-sensitive manner. It is then possible additionally for the direction and therefore as a result the precise location of the partial discharge to be established using running time differences or phase differences between the acoustic sensors. Optionally, provision can be made for the acoustic sensors to be phase-sensitive and/or to be in the form of stereo pickups.

The localization can additionally include identification of the location of a partial discharge. The invention has identified that the partial discharges in general should be considered as being locationally fixed; if a different location is established, such partial discharges at different positions should then always be considered as an additional source of damage. The localization therefore provides the possibility of distinguishing partial discharges in oil from those in solid. A further possibility results from the acoustic signatures of the partial discharges. Those in oil are practically constant, both in terms of the incidence rate and in terms of sound level. This can be attributed to the quantity of oil and the circulation of the oil in association with the fact that the partial discharges are locationally scattered. Since the oil circulates continuously, there is always fresh oil at the location of the partial discharge, with the result that the partial discharges are always the same. They therefore form a type of noise floor. From this it is possible to distinguish easily the partial discharges in the solid which change in terms of incidence rate and sound level.

It is expedient additionally to provide a damage determination unit, which is designed to determine an indicator of a degree of damage of the power component. Thereby, a measure of the damage effected by the occurrence of the partial discharges can be formed. In addition, on the basis of this and preferably with the use of a long-term memory, a measure of an expected residual life can be determined. This makes it possible to decide using such indicators whether the power component needs to be considered in the next maintenance work or whether it can still be operated safely for a longer period of time, for example up to the next but one maintenance date or beyond that. Thus, firstly the risk of unexpected failure can be reduced, as a result of which the reliability of the power component increases, and secondly unnecessary maintenance work can be avoided. The invention has further identified that a particularly significant indicator of the degree of damage is when a plurality of partial discharges occurs at the same location in solid materials. If this is the case, in interaction with the locator unit, such partial discharges will be assigned a higher weighting in the determination of the damage indicator. In this way, the prognosis reliability can be markedly increased.

In addition, expediently an interface is provided by means of which the warning signal is communicated to a (usually remotely situated) operator. Thus, it is possible to decide remotely whether the power component is still sufficiently operationally safe or whether it needs to be repaired or replaced again in the near future as part of maintenance and/or repair work.

In principle, exclusively acoustic sensors are provided for the invention. However, in a variant which may also deserve independent protection, the possibility should not be ruled out that optionally additionally also electromagnetic sensors are provided. For processing the signals thereof together with the acoustic signals, a correlation module can be provided. It is thus possible for the identification reliability to be increased further still. In addition, the localization can be improved.

The invention additionally relates to a corresponding condition monitoring method. For a more detailed explanation, reference is made to the description above.

BRIEF DESCRIPTION OF THE FIGURES

The invention will be explained by way of example below with reference to an advantageous embodiment. In the drawings.

DETAILED DESCRIPTION OF THE DISCLOSURE

Figure 1:
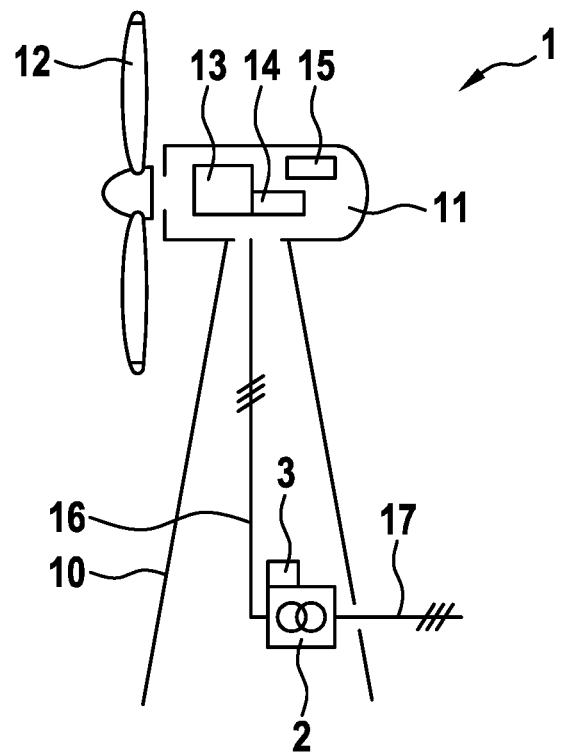
FIG. 1 shows a schematic view of condition monitoring according to the invention on a wind turbine comprising a turbine transformer.

The invention, according to various aspects, will be explained using the example of a transformer (so-called turbine transformer) in the powertrain of a wind turbine. It goes without saying that transformers of other equipment and naturally also transformers for connecting wind farms to a grid can also be correspondingly monitored. A wind turbine denoted in its entirety by the reference numeral 1 with condition monitoring embodied in accordance with the invention is illustrated in FIG. 1.

The wind turbine 1 is embodied per se in a conventional manner with a tower 10 with a nacelle 11 fastened pivotably in the azimuthal direction at the upper end of said tower. A wind rotor 12 is arranged rotatably on an end side of the nacelle 11 and drives a generator 13 via a rotor shaft (not illustrated). The generator 13 interacts with a converter 14 in order to convert the mechanical power of the wind rotor 12 into electrical power. The operation of the wind turbine 1 is controlled by an operation controller 15, to which the components of the wind turbine are connected by means of signal lines (not illustrated).

The electrical power generated is passed through the tower via a riser 16 as far as a turbine transformer 2, arranged at the base of the tower 10 in the exemplary embodiment, of the wind turbine 1. Said turbine transformer is designed to step up the electrical power output at low-voltage level (approximately 1000 V) by the generator 13 or converter 14 with respect to its voltage to medium-voltage level and to output this via a connecting line 17, for example to a wind farm-internal grid (not illustrated).

A condition monitoring system 3 in accordance with an exemplary embodiment of the invention is provided for the turbine transformer 2. Said condition monitoring system is designed to implement the method according to the invention.

The riser 16 conducting the low voltage is connected to a primary side of the transformer 2. The connecting line 17 operated at the medium-voltage level is connected to a secondary side of the transformer 2.

Figure 2:
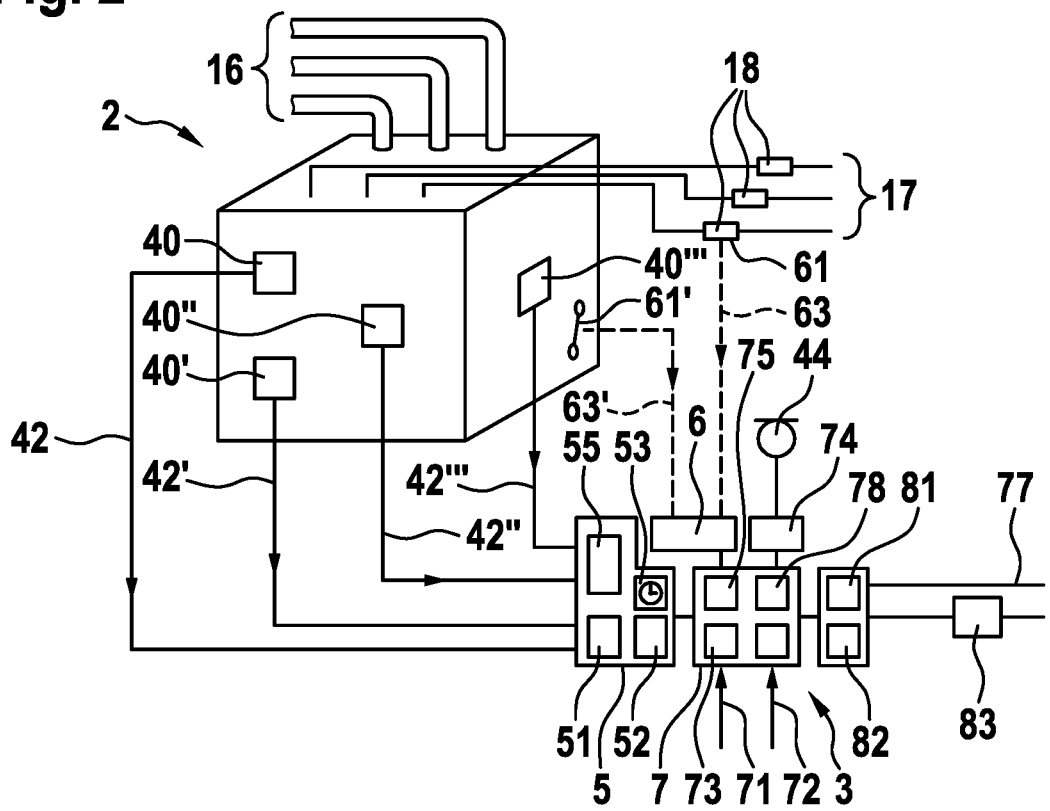
FIG. 2 shows a schematic view of a transformer having a condition monitoring system according to the invention.

Reference will now be made to FIG. 2. Acoustic sensors (A-Sensors) are arranged on the transformer. They are embodied as ultrasonic sensors. The A-Sensor 40 is arranged on the transformer 2 in a manner suitable for sound transmission at a predetermined point, preferably at such a point that has good acoustic coupling to an insulator medium of the transformer 2, which insulator medium preferably comprises solid material, in particular oil paper. This A-Sensor 40 is designed to detect acoustically detectable partial discharges in the solid insulator medium and in the oil and to output corresponding signals via a signal line 42 to a processing unit 5 of the condition monitoring system 3.

Furthermore, optionally additional acoustic sensors (A-Sensors) 40', 40", 40''' are provided. In this case, three of the A-Sensors 40, 40', 40" are arranged in a triple group, to be precise in the form of an equilateral triangle. In addition, A-Sensor 40''' is arranged slightly offset; this can optionally be in the form of a stereo pickup. The A-Sensors 40', 40", 40''' are connected to the processing unit 5 via further signal lines 42', 42", 42'''.

The processing unit 5 has an incidence rate determination device 51 as input stages, with the signals of the A-Sensors 40, 40', 40", 40''' being connected to said incidence rate determination device.

The processing unit 5 additionally has a histogram module 52, which is designed to determine a time characteristic of the incidence rate from the incidence rate signal established by the incidence rate determination device 51 and a time signal controlled by a timer 53. In this way, it is possible to establish how often the incident "partial discharge" detected by the acoustic sensors 40 occurs over the course of time. It is thus possible to determine changes in the incidence rate, in particular to what extent the incidence rate rises or falls or remains at a more constant level (whether it be a high or low level). This analysis of the incidence rate and changes therein takes place by means of an analysis unit 7, which interacts with the processing unit 5. The analysis unit 7 additionally also has further inputs, namely those for signals for threshold values, in particular static or dynamic threshold values 71, 72. The analysis unit is designed to evaluate the time characteristic determined by the histogram module 52, in particular to monitor said time characteristic for fall and/or rise, and to output a warning signal when the threshold values is exceeded. A warning line 77 is provided for the output of the warning signal.

Figure 3:
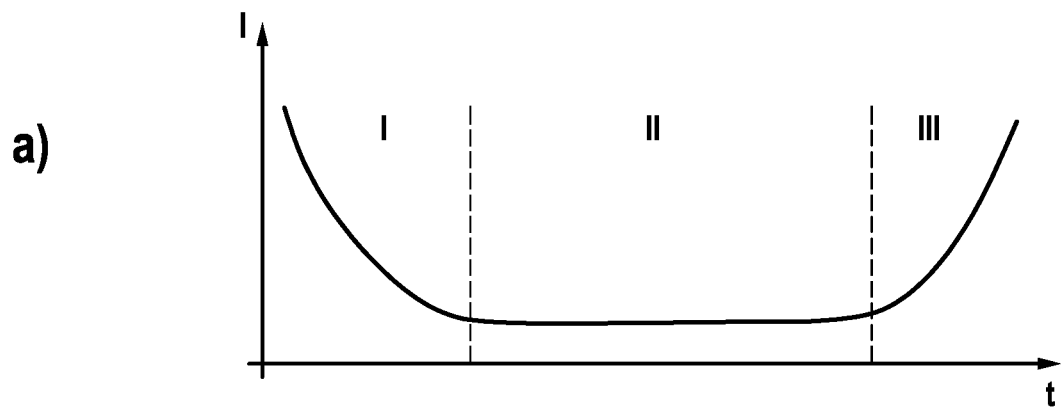
FIGS. 3a-c show graphs illustrating a reference pattern and measured values with threshold values of the condition monitoring.
Figure 3:
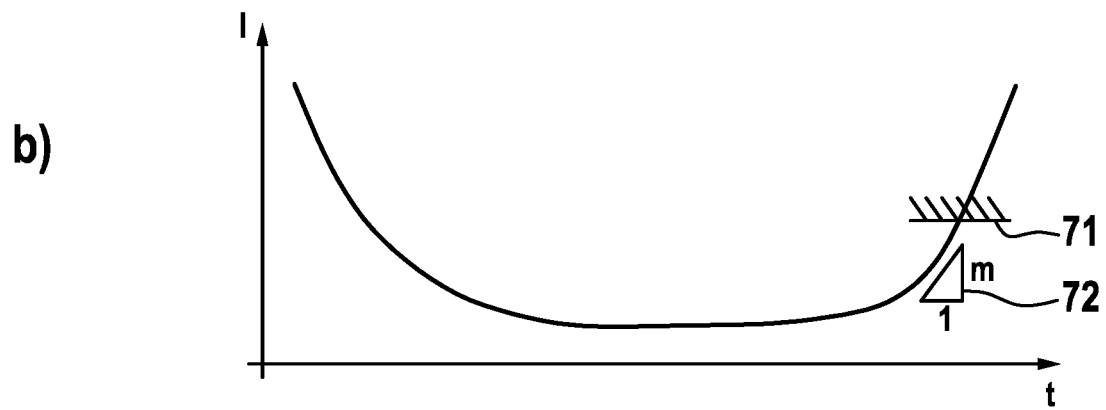
Figure 3:
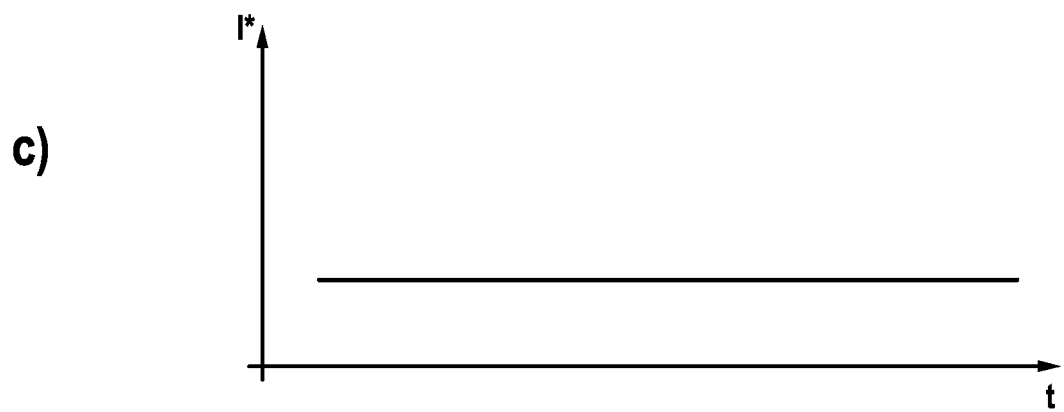

The analysis unit 7 has a pattern identification module 73, which has a pattern memory (not illustrated). One or more reference patterns can be stored in the pattern memory. The analysis unit 7 checks, by means of the pattern identification module 73, whether the determined time characteristic of the incidence rate corresponds to a reference pattern, and correspondingly outputs signals. An example of such a reference pattern is illustrated in FIG. 3a). Said figure shows a typical characteristic of the incidence rate I of acoustically detectable partial discharges in the solid material (in the present example, therefore, oil paper insulation) over time t in the case of a transformer as electrical power component. Three phases I, II and III can be identified, wherein phase I represents a start or "burn-in" phase and comprises the starting per se and the first operating hours to days. It is typical for this first phase that partial discharges occur very often at the start. This is characteristic. Thus, both very loud and frequent partial discharges occur right at the start. It is assumed that the first partial discharge is in principle the loudest, and the subsequent partial discharges become tendentially ever quieter and less frequent. Therefore, phase I provides a good possibility for reliably identifying phase II, in particular by a comparison of the incidence rates of partial discharges.

Phase II shows the subsequent phase of the stable continuous operation. In this case, partial discharges occur less often and are weaker, with the result that they cannot always be reliably detected acoustically. This therefore results in a lower incidence rate of the detected partial discharges over a relatively long period of time (so-called low plateau level). This is the safe and reliable condition desired per se for continuous operation. Towards the end of life, phase III begins. Here, the incidence rate of the partial discharges rises markedly and can reach high values very quickly. If this rise is identified, this indicates the occurrence of damage to the transformer, and the transformer should be repaired or replaced soon in the interests of reliability. This can take place when a static threshold value 71 is exceeded (for example more than 100 partial discharges over a time period of five minutes in one position) or when the rate of rise is too great and thus a dynamic threshold value 72 is exceeded (for example when the incidence rate has more than doubled in a measurement interval of a few minutes/hours). It goes without saying that both the level of the threshold and/or the time period over which the detection runs can be varied. The detection time period is therefore advantageously likewise variable. Depending on the nature and type of the electrical component, a distinction can be made as to whether the threshold value is set at 20 partial discharges in one minute or at 100 partial discharges in five minutes.

The above-described example of a reference pattern therefore corresponds to a "bath-tub" characteristic. However, further, different reference patterns can also be stored in the pattern memory.

FIG. 3b) shows an example of a measured time characteristic of the incidence rate. The start phase with the characteristic fall in the incidence rate of the partial discharges and the plateau phase extending over a long period of time with only few acoustically detected partial discharges can be seen. Towards the end, the incidence rate rises markedly in order to exceed, due to the high rate of rise, first a dynamic threshold 72 and, shortly thereafter, owing to the marked rise in the incidence rate, also the static threshold 71. The warning signal 77 is triggered.

The reference pattern merely forms a schematic pattern. In general, it is not absolutely scaled. Its scaling needs to be matched to the respective application case. This takes place as part of a calibration. The initial calibration can take place in particular, owing to the incidence rate of the initially occurring partial discharges, at the beginning of phase I. The incidence rate of said partial discharges is detected and mapped, by means of a suitable calibration factor, onto the corresponding absolute value at the start of phase I in accordance with the reference pattern. The corresponding calibration factor is expediently determined by automatic amplification control 75, with the result that, ultimately, automatic matching is achieved by this amplification control. This is also suitable in particular for the plateau range in accordance with phase II. Owing to the automatic amplification control, a multiplication value is determined which scales the actually measured value for the incidence rate during this phase II to the corresponding value of the reference pattern. In this way, different application cases, for example in the case of power components of different sizes (or different types of power components) can be covered by one reference pattern. The calibration thus determined preferably extends also to the end range in phase III.

For better matching to different types of power components, provision is preferably made for different reference patterns to be stored in the memory, of which patterns each is oriented to a specific type of power component.

FIG. 3c shows an acoustic signature of the incidence rate I* of partial discharges in oil. It can be seen that the signature of said partial discharges remains constant over time. This is because although the partial discharges in oil typically occur at the same point, owing to the oil circulation there is always fresh oil available at this point, with the result that there is no change in the incidence rate of the partial discharge owing to carbonization effects. In principle, the incidence rate of this partial discharge represents the basis for the acoustic evaluation, as is dominant in particular for phase II.

In order to be able to better determine the location of the partial discharges, provision is optionally made for the processing unit 5 to comprise a locator unit 55. The signals of a plurality of the A-Sensors 40, 40', 40", 40''' are applied to said locator unit. Said locator unit is designed to determine location information relating to the location of the partial discharge from the signals of the plurality of A-Sensors, for example by determining running time differences or triangulation. In this way, in addition the location of the respective partial discharges can be taken into consideration. This enables markedly improved determination of the effect of the partial discharges since a plurality of partial discharges occurring at the same point is a clear indication of damage to the electrical power component and generally results in accelerated failure. In addition, locational discrepancies of the partial discharges can be identified, which can likewise be an indication of imminent failure.

In addition, a switch-on lockout 78 is optionally provided. Said switch-on lockout monitors shutdown or restarting of the transformer 2, for example by monitoring the terminal voltage thereof by means of a voltage sensor (not illustrated). On identification of the switching operations, the evaluation by processing unit 5 or analysis unit 7 is blocked. It is thus possible to avoid a situation whereby the evaluation is falsified owing to partial discharges which are caused by the switching operations. The quality of the evaluation is thus increased.

Optionally, an adaptation device is furthermore provided. Expediently, said adaptation device is in the form of a unit for disturbance variable detection 74. Said unit is used for detecting the environmental noise and interacts with the analysis unit 7. Thereby, calibration matched to the respective environmental noise can be achieved, with the result that this noise does not impair the processing and evaluation of the measured acoustic signals. However, it may also arise that, owing to environmental influences, the measurement is falsified by the acoustic sensors 40 themselves. An example of this are effects of heavy rain drops in the case of transformers arranged outdoors. The drops incident generate an acoustic signature which may sometimes be similar to that of the partial discharges. In order to avoid erroneous assignment to this extent, the presence of the disturbance variable (in the present example: heavy rain) is identified by means of a suitable environmental noise sensor 44 and corresponding intervention is initiated, via the disturbance variable detection 74 of the adaptation device, in the signal processing of the signals measured by the acoustic sensors 40 in order thus to compensate for the influence of the disturbance variable "acoustic emissions caused by heavy rain drops". In the simplest case, this may mean ignoring the signals detected by the A-Sensors 40 during the disturbance as a result of the heavy rain. A better option are advanced signal processing methods, for example using convolution operations by means of so-called optimal filters. In this way, the robustness of the measurements and the quality of the evaluation are considerably increased.

In addition, a damage determination unit 8 is expediently provided, which determines an indicator of a degree of damage from the signal thus established. This indicator indicates the extent of the detected partial discharges taking into consideration the operating time of the transformer 2. For this purpose, the damage determination unit 8 expediently has a long-term memory 81. In addition, it preferably has a module 82 for determining an expected residual life. In this way, it is possible to establish whether the transformer 2 still has a sufficiently long residual life until a later planned maintenance cycle or whether it should be replaced as soon as possible, preferably at the next maintenance interval. The corresponding signal can be communicated via an interface 83 to the operational controller 15 or to another, possibly remote point (for example the operator of a wind farm to which the wind turbine 1 is assigned).

In a particularly expedient embodiment which may also deserve independent protection, optionally additionally also electrical and/or electromagnetic sensors can be provided. For example, electrical sensors (E sensors) can be provided which are embodied as impedances 18 which are arranged on the connecting line 17 and which act as measuring resistors for obtaining electrical signals in the transformer 2. The measuring resistors 18 therefore act as E sensors 61 for detecting electrical signals of a partial discharge in the transformer 2. A further sensor 61' for detecting electromagnetic signals of the partial discharges can be provided directly in the transformer 2. Said sensors are connected to a correlation unit 6 of the condition monitoring system 3 via signal lines 63, 63'. Said correlation unit is designed for a correlation between electrical and acoustic signals and, thanks to this correlation, can also take into consideration those (silent) partial discharges which have not been detected by the A-Sensors 40. The correlation unit 6 can also be designed to form a strength ratio of the signals established by the A-Sensors 40 and the E sensors 61 and/or an incidence rate ratio. In this way, further information relating to partial discharges can be obtained, even those in the oil of transformers, and to a larger extent abnormal changes can be identified, on the basis of which the warning signal 77 is then output.

The invention claimed is:

1. A condition monitoring system for monitoring at least one electrical power component, comprising:
   a partial discharge detector configured to detect partial discharges from the at least one electrical power component and comprising at least one acoustic sensor for detecting acoustic signals of the partial discharges;
   a processing unit configured to process the acoustic signals detected by the acoustic sensor, detecting an incidence rate of the partial discharges detected by the acoustic sensor, outputting an incidence rate signal, and determining a time characteristic of the incidence rate from the incidence rate signal and a time signal; and
   an analysis unit configured to monitor the time characteristic for at least one of fall and rise, and to trigger a warning signal when a settable threshold is exceeded.

2. The condition monitoring system of claim 1, wherein the analysis unit is configured to assess whether the time characteristic corresponds to at least one reference pattern.

3. The condition monitoring system of claim 2, wherein the at least one reference pattern is polyphasic.

4. The condition monitoring system of claim 3, wherein the at least one reference pattern comprises a start phase, a main phase, and an end phase.

5. The condition monitoring system of claim 2, wherein the reference pattern is automatically parameterized.

6. The condition monitoring system of claim 5, wherein the at least one reference pattern is automatically parameterized via automatic amplification control.

7. The condition monitoring system of claim 6, wherein the at least one reference pattern is polyphasic and is automatically parameterized individually for each phase.

8. The condition monitoring system of claim 1, comprising an adaptation device configured to calibrate the analysis unit in respect of environmental noise.

9. The condition monitoring system of claim 1, wherein the analysis unit comprises a disturbance variable detector.

10. The condition monitoring system of claim 9, wherein the disturbance variable detector is connected to an environmental noise sensor.

11. The condition monitoring system of claim 1, wherein the analysis unit is further configured to calculate a rate of rise of the incidence rate and, depending thereon, to trigger the warning signal.

12. The condition monitoring system of claim 1, wherein the threshold comprises a static or dynamic threshold value.

13. The condition monitoring system of claim 1, further comprising a switch-on lockout that interacts with at least one of the processing unit and the analysis unit in such a way that, during restarting, the monitoring of the partial discharges is blocked.

14. The condition monitoring system of claim 1, wherein a plurality of acoustic sensor is arranged spatially distributed on the at least one power component, wherein at least one of the acoustic sensor is arranged directly on the at least one electrical power component.

15. The condition monitoring system of claim 1, further comprising a locator for processing the acoustic sensor signals to determine location information relating to the partial discharge.

16. The condition monitoring system of claim 15, wherein the locator is configured to detect locational discrepancies of the partial discharges.

17. The condition monitoring system of claim 1, comprising a damage determination unit for determining an indicator of a degree of damage of the power component.

18. The condition monitoring system of claim 17, wherein the damage determination unit assesses intensity and location of the detected partial discharges.

19. The condition monitoring system of claim 18, wherein the damage determination unit applies a higher weighting to partial discharges with the same location.

20. The condition monitoring system of claim 1, wherein the at least one electrical power component comprises a transformer.

21. A method for condition monitoring of electrical power components for detecting partial discharges, comprising the following steps:
  detecting acoustic signals using at least one acoustic sensor and determining an incidence rate of the detected partial discharges;
  generating a time characteristic of the incidence rate on the basis of the incidence rate signal and a time signal;
  monitoring the time characteristic of the incidence rate for at least one of fall and rise; and
  triggering a warning signal when a threshold is exceeded by the at least one of fall and rise.

* * * * *